(12) United States Patent
Tan et al.

(10) Patent No.: US 11,239,081 B2
(45) Date of Patent: Feb. 1, 2022

(54) METHOD FOR PREPARING OHMIC CONTACT ELECTRODE OF GALLIUM NITRIDE-BASED DEVICE

(71) Applicant: THE 13TH RESEARCH INSTITUTE OF CHINA ELECTRONICS TECHNOLOGY GROUP CORPORATION, Hebei (CN)

(72) Inventors: Yongliang Tan, Shijiazhuang (CN); Xingzhong Fu, Shijiazhuang (CN); Zexian Hu, Shijiazhuang (CN); Xiangwu Liu, Shijiazhuang (CN); Lijiang Zhang, Shijiazhuang (CN); Yuxing Cui, Shijiazhuang (CN); Xingchang Fu, Shijiazhuang (CN)

(73) Assignee: THE 13TH RESEARCH INSTITUTE OF CHINA ELECTRONICS, Hebei (CN)

( * ) Notice: Subject to any disclaimer, the term of this patent is extended or adjusted under 35 U.S.C. 154(b) by 0 days.

(21) Appl. No.: 16/968,977

(22) PCT Filed: Feb. 27, 2019

(86) PCT No.: PCT/CN2019/076323
§ 371 (c)(1),
(2) Date: Aug. 11, 2020

(87) PCT Pub. No.: WO2019/165975
PCT Pub. Date: Sep. 6, 2019

(65) Prior Publication Data
US 2021/0057221 A1    Feb. 25, 2021

(30) Foreign Application Priority Data
Feb. 28, 2018 (CN) .......................... 201810166841.8

(51) Int. Cl.
H01L 21/44 (2006.01)
H01L 23/48 (2006.01)
(Continued)

(52) U.S. Cl.
CPC ........ H01L 21/2258 (2013.01); H01L 21/043 (2013.01); H01L 21/28575 (2013.01);
(Continued)

(58) Field of Classification Search
CPC ....................... H01L 21/76801; H01L 51/105
(Continued)

(56) References Cited

U.S. PATENT DOCUMENTS 6,897,137 B2   5/2005   Nguyen
7,700,974 B2   4/2010   Nguyen
(Continued)

FOREIGN PATENT DOCUMENTS

CN   101136409 A   3/2008
CN   101207085 A   6/2008
(Continued)

OTHER PUBLICATIONS

International Search Report in the international application No. PCT/CN2019/076323, dated May 30, 2019, 2 pgs.
(Continued)

*Primary Examiner* — Calvin Lee
(74) *Attorney, Agent, or Firm* — Cooper Legal Group, LLC

(57) ABSTRACT

A method for preparing an ohmic contact electrode of a GaN-based device. Said method comprises the following steps: growing a first dielectric layer (203) on an upper surface of a device (S1); implanting silicon ions and/or indium ions in a region of the first dielectric layer (203) corresponding to an ohmic contact electrode region, and in the ohmic contact electrode region of the device (S2);
(Continued)

growing a second dielectric layer (206) on an upper surface of the first dielectric layer (203) (S3); activating the silicon ions and/or the indium ions by means of a high temperature annealing process, so as to form an N-type heavy doping (S4); respectively removing portions, corresponding to the ohmic contact electrode region, of the first dielectric layer (203) and the second dielectric layer (206) (S5); growing a metal layer (208) on the upper surface of the ohmic contact electrode region of the device, so as to form an ohmic contact electrode (S6). The ohmic contact electrode prepared by the method can ensure that the metal layer (208) has flat surfaces, smooth and regular edges, and said electrode has stable device breakdown voltage, and is reliable and has a long service life.

14 Claims, 2 Drawing Sheets

(51) Int. Cl.
  *H01L 21/225* (2006.01)
  *H01L 21/285* (2006.01)
  *H01L 21/3115* (2006.01)
  *H01L 51/10* (2006.01)
  *H01L 21/04* (2006.01)
  *H01L 21/768* (2006.01)
  *H01L 23/532* (2006.01)
  *H01L 21/311* (2006.01)
  *H01L 29/45* (2006.01)

(52) U.S. Cl.
  CPC .. *H01L 21/31155* (2013.01); *H01L 21/76801* (2013.01); *H01L 23/53295* (2013.01); *H01L 51/105* (2013.01); *H01L 21/31116* (2013.01); *H01L 29/452* (2013.01)

(58) Field of Classification Search
  USPC .................................. 257/745; 438/674, 677
  See application file for complete search history.

(56) References Cited

U.S. PATENT DOCUMENTS

| | | | |
|---|---|---|---|
| 8,823,057 B2* | 9/2014 | Sheppard | H01L 29/66462 257/192 |
| 9,024,324 B2* | 5/2015 | Teplik | H01L 29/7789 257/76 |
| 9,343,542 B2* | 5/2016 | Kalnitsky | H01L 21/0254 |
| 10,128,364 B2* | 11/2018 | Hill | H01L 29/7786 |
| 10,355,085 B1* | 7/2019 | Huang | H01L 29/6631 |
| 2004/0094759 A1 | 5/2004 | Nguyen | |
| 2005/0184309 A1 | 8/2005 | Nguyen | |
| 2006/0226442 A1 | 10/2006 | Zhang | |

FOREIGN PATENT DOCUMENTS

| | | |
|---|---|---|
| CN | 101431024 A | 5/2009 |
| CN | 101567317 A | 10/2009 |
| CN | 101894748 A | 11/2010 |
| CN | 102087961 A | 6/2011 |
| CN | 102738224 A | 10/2012 |
| CN | 103928324 A | 7/2014 |
| CN | 103928511 A | 7/2014 |
| CN | 104112658 A | 10/2014 |
| CN | 104966667 A | 10/2015 |
| CN | 108597997 A | 9/2018 |
| JP | 2007189213 A | 7/2007 |
| JP | 2007258364 A | 10/2007 |
| JP | 2010245268 A | 10/2010 |
| JP | 2013500606 A | 1/2013 |
| JP | 2013058774 A | 3/2013 |

OTHER PUBLICATIONS

English translation of the Written Opinion of the International Search Authority in the international application No. PCT/CN2019/076323, dated May 30, 2019, 5 pgs.

* cited by examiner

METHOD FOR PREPARING OHMIC CONTACT ELECTRODE OF GALLIUM NITRIDE-BASED DEVICE

The present application is filed based upon and claims priority to Chinese Patent Application No. 201810166841.8, filed on Feb. 28, 2018 and entitled "METHOD FOR PREPARING OHMIC CONTACT ELECTRODE OF GALLIUM NITRIDE-BASED DEVICE", the contents of which are hereby incorporated by reference in its entirety.

TECHNICAL FIELD

The disclosure relates to the field of semiconductor technology, and particularly to a method for preparing an ohmic contact electrode of a gallium nitride (GaN)-based device.

BACKGROUND

As a wide band gap semiconductor, GaN has some advantages such as wide band gap, high density two-dimensional electron gas when combined with AlGaN, high breakdown field strength and high saturated electron drift velocity, and it has great potential in the field of manufacturing of high temperature microwave power devices and high-speed power electronic devices. In a GaN-based device, a state-of-the-art ohmic contact electrode can not only improve the performance of the device but also prolong the working life of the device. A conventional method manufactures an ohmic contact electrode by performing a fast thermal annealing process on a metal layer in a temperature higher than 800° C. But the ohmic contact electrode formed by the conventional method is low in quality, it has disadvantages such as rough metal surface topography and uneven metal edges, which may cause problems such as a high possibility of an electric breakdown in the devices and a decrease in the reliability and the life expectancy of the devices.

SUMMARY

Technical Problem

In view of the above, the embodiments of the disclosure provide a method for preparing an ohmic contact electrode of a GaN-based device to solve a problem that ohmic contact electrodes produced by current technologies are low in quality.

Technical Solutions

The embodiments of the disclosure provide a method for preparing an ohmic contact electrode of a GaN-based device and the method includes following steps:
step S1: a first dielectric layer is grown on an upper surface of the device;
step S2: silicon ions and/or indium ions are implanted into a region of the first dielectric layer corresponding to an ohmic contact electrode region of the device and into the ohmic contact electrode region;
step S3: a second dielectric layer is grown on an upper surface of the first dielectric layer;
step S4: the silicon ions and/or the indium ions are activated using a high temperature annealing process, so as to form an N-type highly doped region;
step S5: portions, corresponding to the ohmic contact electrode region, of the first dielectric layer and the second dielectric layer are respectively removed; and
step S6: a metal layer is formed on an upper surface of the ohmic contact electrode region of the device, so as to form the ohmic contact electrode.

According to an embodiment of the disclosure, the step S2 may specifically include following steps:
step S21: a first photoresist layer is applied to an upper surface of a portion of the first dielectric layer corresponding to a first region of the device, and the first region is a region other than the ohmic contact electrode region of the device;
step S22: the silicon ions and/or indium ions are implanted using ion implantation; and
step S23: the first photoresist layer is removed.

According to an embodiment of the disclosure, S3 and S4 may specifically include following steps:
step S31: a second photoresist layer is applied to an upper surface of a portion of the second dielectric layer corresponding to the first region;
step S32: portions of the first dielectric layer and the second dielectric layer corresponding to the ohmic contact electrode region respectively are removed using a dry etching process;
step S33: evaporation deposition of the metal layer on an upper surface of the device is performed using an electron beam evaporation process; and
step 34: the second photoresist layer is removed.

According to an embodiment of the disclosure, the first dielectric layer may be an SiN layer or an $SiO_2$ layer, and the first dielectric layer may have a thickness of 10 to 50 nanometers.

According to an embodiment of the disclosure, the second dielectric layer may be an SiN layer or an MN layer, and the second dielectric layer may have a thickness of 10 to 200 nanometers.

According to an embodiment of the disclosure, the silicon ions may have an implantation energy of 30 to 200 keV and an implantation dose of $10^{14} cm^{-2}$ to $10^{16} cm^2$ and the indium ions may have an implantation energy of 30 to 200 keV and an implantation dose of $10^{13} cm^{-2}$ to $10^{16} cm^{-2}$;

According to an embodiment of the disclosure, the metal layer may include a Ti/Au layer, a Ti/Pt/Au layer, a Ti/Al layer or a Ti/Al/Ni/Au layer.

According to an embodiment of the disclosure, the silicon ions and/or the indium ions may have an implantation depth of 80 to 120 nanometers.

According to an embodiment of the disclosure, a process condition of the high temperature annealing process may include: an annealing temperature of 850 to 1400° C. and an annealing duration of 10 to 60 minutes

Beneficial Effects

In the embodiments of the disclosure, a first dielectric layer is grown on an upper surface of a device as an ion implantation scattering layer, silicon ions and/or indium ions are implanted into an ohmic contact electrode region of the device and into a region of the first dielectric layer corresponding to the ohmic contact electrode region, a second dielectric layer is grown on an upper surface of the first dielectric layer as a protective layer, the silicon ions and/or the indium ions are activated using a high temperature annealing process, so as to form an N-type highly doped region, finally portions, corresponding to the ohmic contact electrode region, of the first dielectric layer and the second dielectric layer are removed so that the ohmic contact electrode region is exposed, and a metal layer is formed on an upper surface of the ohmic contact electrode region of the device, so as to form the ohmic contact electrode. Because the metal layer does not need to undergo the high temperature annealing process, the ohmic contact electrodes with good quality can be manufactured, which can guarantee that the metal layer has an smooth surface and edges, and the device has a steady breakdown voltage, good reliability and long life expectancy.

DETAILED DESCRIPTION

The technical solution in the disclosure will be described as follows in combination with the embodiments of the disclosure.

Figure 1:
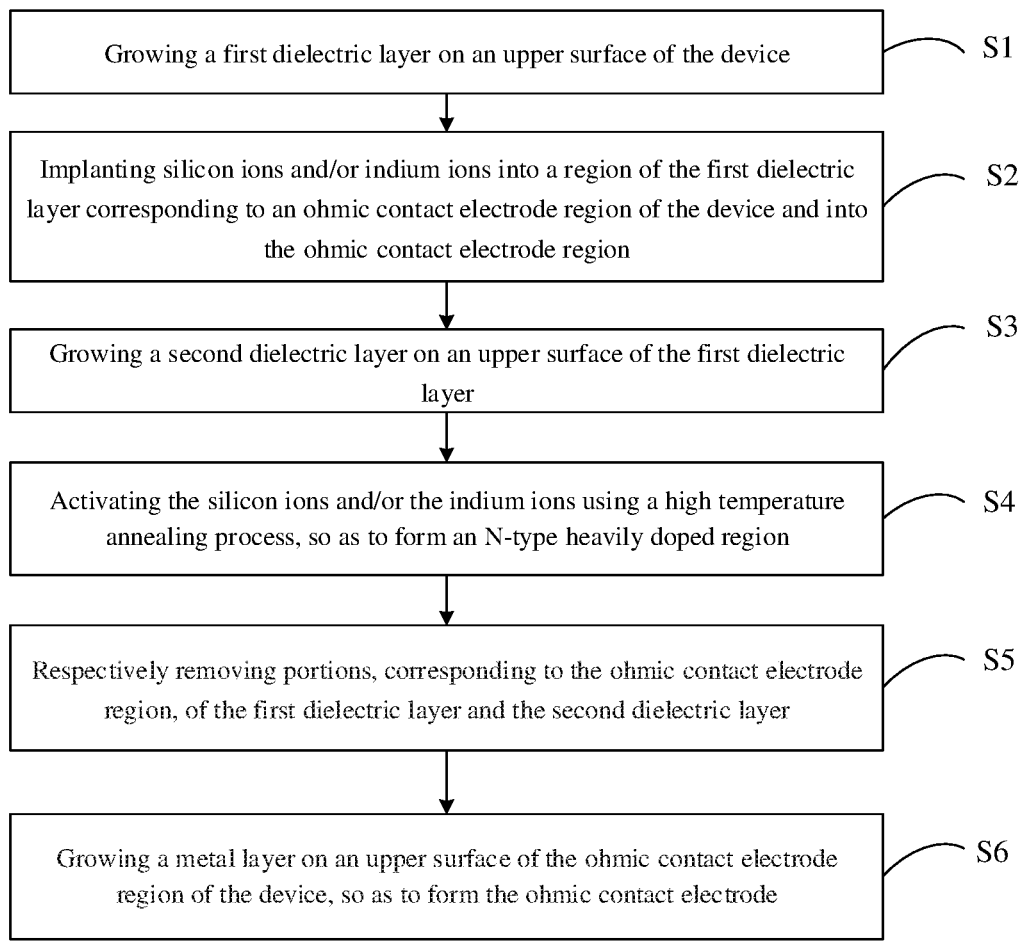
FIG. 1 is a schematic diagram illustrating an implementation flow of a method for preparing an ohmic contact electrode of a GaN-based device according to an embodiment of the disclosure.

Referring to FIG. 1, the method for preparing an ohmic contact electrode of a GaN-based device includes the following steps S1 to S6.

In step S1, a first dielectric layer is grown on an upper surface of the device.

In an embodiment of the disclosure, the first dielectric layer is an SiN layer or an SiO2 layer, has a thickness of 10 to 50 nanometers and can be used as an ion implantation scattering layer in subsequent processes.

Figure 2:
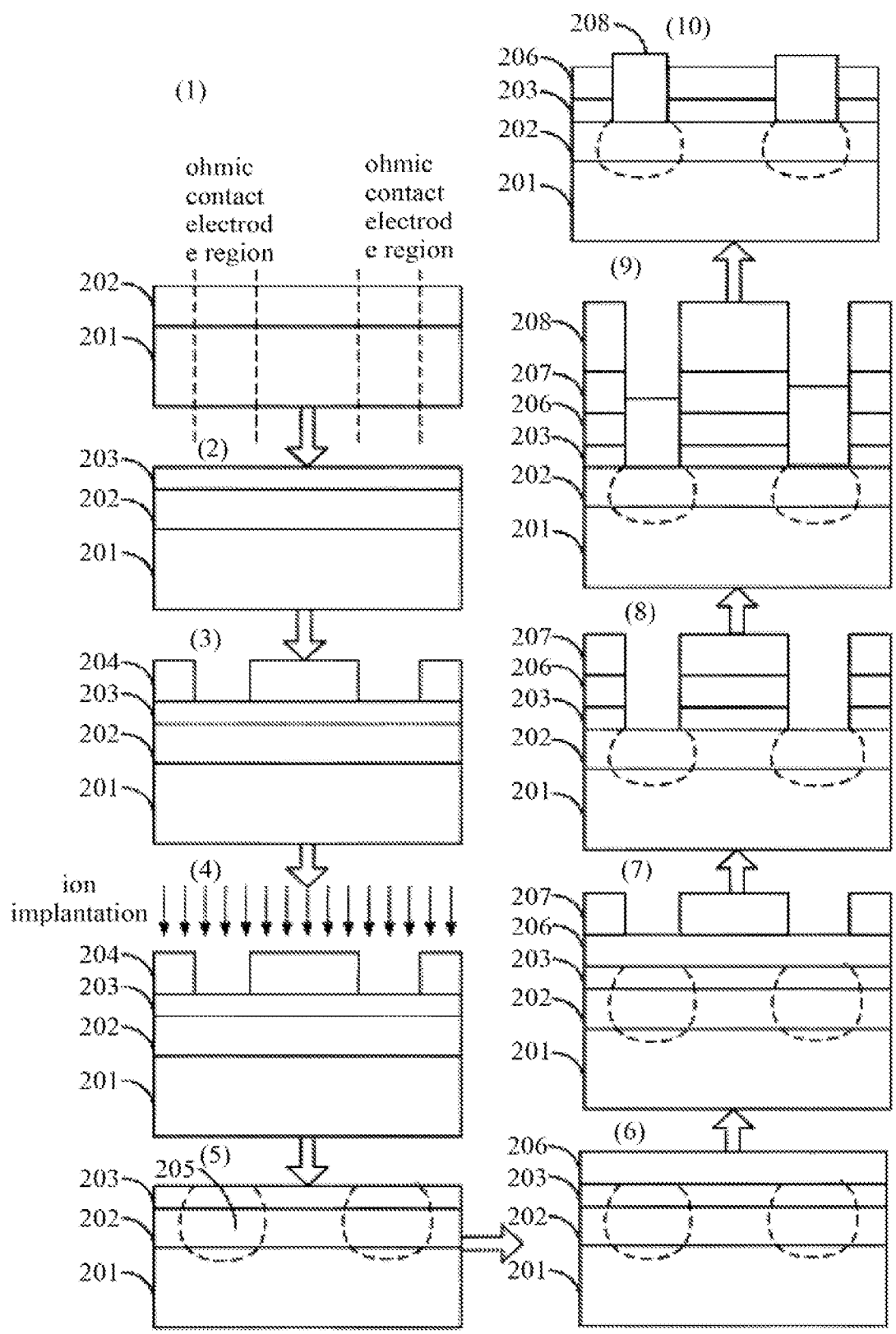
FIG. 2 is a schematic diagram illustrating structures obtained during an implementation flow of the method for preparing an ohmic contact electrode of a GaN-based device according to an embodiment of the disclosure.

Referring to FIG. 2 (1), the GaN-based device in the embodiment of the disclosure includes a GaN substrate 201 and an AlGaN layer 202, and the GaN-based device includes ohmic contact electrode regions and a first region. The first region is a region other than the ohmic contact electrode regions of the device, and the ohmic contact electrodes are prepared in the ohmic contact electrode regions of the GaN-based device. Referring to FIG. 2 (2), a first dielectric layer 203 is deposited on an upper surface of the AlGaN layer 202 as an ion implantation scattering layer using chemical vapor deposition.

In step S2, silicon ions and/or indium ions are implanted into a region of the first dielectric layer corresponding to an ohmic contact electrode region of the device and into the ohmic contact electrode region.

In the embodiment of the disclosure, the silicon ions have an implantation energy of 30 to 200 keV and an implantation dose of $10^{14} cm^{-2}$ to $10^{16} cm^{-2}$ and the indium ions have an implantation energy of 30 to 200 keV and an implantation dose of $10^{13} cm^{-2}$ to $10^{16} cm^{-2}$.

According to an embodiment of the disclosure, a specific implementation of the step S2 is: a first photoresist layer is applied to an upper surface of a portion of the first dielectric layer corresponding to a first region of the device, and the first region is a region other than the ohmic contact electrode regions of the device; the silicon ions and/or indium ions are implanted using ion implantation; and the first photoresist layer is removed.

Referring to FIG. 2 (3) to FIG. 2(5), the upper surface of the portion of the first dielectric layer corresponding to the first region is covered with the first photoresist layer 204 by using processes of photoresist application, exposure, development and hardening so that portions of the first dielectric layer corresponding to the ohmic contact electrode regions are exposed. The first photoresist layer 204 has a thickness of 2 to 5 micrometers. Then silicon ions and/or indium ions are implanted using ion implantation and the ions are merely implanted into the exposed portions of first dielectric layer 204 corresponding to the ohmic contact electrode regions and into the ohmic contact electrode regions of the device, i.e., the dotted regions designated 205 in FIG. 2 (5); and the ions will not be implanted into other portions because the other portions are protected by the first photoresist layer 204; finally the first photoresist layer 204 is removed.

In step S3, a second dielectric layer is grown on an upper surface of the first dielectric layer.

In the embodiment of the disclosure, referring to FIG. 2 (6); the second dielectric layer 206 includes an SiN layer or an MN layer, and the second dielectric layer 206 has a thickness of 10 to 200 nanometers. The second dielectric layer is used as a protective layer in the subsequent high temperature annealing process.

In step S4, the silicon ions and/or the indium ions are activated using a high temperature annealing process, so as to form an N-type highly doped region.

In the embodiment of the disclosure, the annealing temperature is 850 to 1400° C. and the annealing lasts 10 to 60 minutes. The implanted silicon ions and/or indiums ions activated by the high temperature annealing process enables the formation of N-type highly doped regions.

In step S5, portions, corresponding to the ohmic contact electrode region, of the first dielectric layer and the second dielectric layer are respectively removed.

In step S6, a metal layer is grown on an upper surface of the ohmic contact electrode region of the device, so as to form the ohmic contact electrode.

In the embodiment of the disclosure, the metal layer is a Ti/Au layer, a Ti/Pt/Au layer, a Ti/Al layer or a Ti/Al/Ni/Au layer.

Referring to FIG. 2 (7) to FIG. 2 (10), a specific implementation of the step S5 and the step S6 is: the second photoresist layer 207 is applied to the upper surface of the portion of the second dielectric layer 206 corresponding to the first region; the portions of the first dielectric layer 203 and the second dielectric layer 206 corresponding to the ohmic contact electrode regions are removed respectively using the dry etching process; the evaporation deposition of the metal layer 208 on an upper surface of the device is performed using the electron beam evaporation process; and the second photoresist layer 207 is removed.

In the embodiment of the disclosure, the upper surface of the portion of the second dielectric layer 206 corresponding to the first region is covered with the second photoresist layer 207 by using processes of photoresist application, exposure, development and hardening to expose the portions of the second dielectric layer 206 corresponding to the ohmic contact electrode regions. The second photoresist layer 207 has a thickness of 1 to 2 micrometers. The portions of the first dielectric layer 203 and the second dielectric layer 206 corresponding to the ohmic contact electrode regions are removed using the dry etching process to expose the ohmic contact regions of the device. The metal layer 208 is subjected to the evaporation deposition using the electron beam evaporation process and finally the second photoresist layer 207 is removed. The metal layer 208 contacts the N-type highly doped AlGaN layer 202 and forms an ohmic contact.

In the embodiments of the disclosure, the first dielectric layer 203 is grown on the upper surface of the device as the ion implantation scattering layer, silicon ions and/or indium ions are implanted into the ohmic contact electrode region of the device and into the region of the first dielectric layer 203 corresponding to the ohmic contact electrode region, the second dielectric layer 206 is grown on the upper surface of the first dielectric layer as the protective layer, the silicon ions and/or the indium ions are activated using the high temperature annealing process, so as to form the N-type highly doped region, finally portions, corresponding to the ohmic contact electrode region, of the first dielectric layer 203 and the second dielectric layer 206 are removed so that the ohmic contact electrode region is exposed, and the metal layer 208 is grown on the upper surface of the ohmic contact electrode region of the device, so as to form the ohmic contact electrode. Because the metal layer does not need to undergo the high temperature annealing process, the ohmic contact electrodes of with good quality can be manufactured, which can guarantee that the metal layer has an even surface and smooth and clean edges, and the device has a steady breakdown voltage, good reliability and long life expectancy.

It can be understood that the numbers of all the steps in the above embodiments of the disclosure do not necessarily stand for their implementation order, and the implementation order of each process should be determined by its function and inner logic, thus the sequence indicated by the numbers of all the steps is not intended to limit an implementation process of the embodiments of the disclosure.

The above-mentioned embodiments of the disclosure are merely used to describe rather than limit the technical solutions of the disclosure. Although the disclosure is described in detail according to the above-mentioned embodiments of the disclosure, those skilled in the art should understand that the technical solutions recited in respective above-mentioned embodiments of the disclosure can be modified or parts of technical features in the technical solutions can be substituted by technically equivalent elements. The modifications or substitutions without departing from the spirit and the scope of the technical solutions of the embodiments of the disclosure all fall within the scope of protection of the disclosure.

The invention claimed is:

1. A method for preparing an ohmic contact electrode of a gallium nitride (GaN)-based device, comprising following steps:
   step S1: growing a first dielectric layer on an upper surface of the GaN-based device;
   step S2: implanting at least one of silicon ions or indium ions into a region of the first dielectric layer corresponding to an ohmic contact electrode region of the GaN-based device and into the ohmic contact electrode region;
   step S3: growing a second dielectric layer on an upper surface of the first dielectric layer;
   step S4: activating the at least one of silicon ions or indium ions using a high temperature annealing process, so as to form an N-type highly doped region;
   step S5: respectively removing portions, corresponding to the ohmic contact electrode region, of the first dielectric layer and the second dielectric layer; and
   step S6: growing a metal layer on an upper surface of the ohmic contact electrode region of the GaN-based device, so as to form the ohmic contact electrode,
   wherein the step S2 comprises:
      step S21: applying a first photoresist layer to an upper surface of a portion of the first dielectric layer corresponding to a first region of the GaN-based device, wherein the first region is a region other than the ohmic contact electrode region of the GaN-based device;
      step S22: implanting the at least one of silicon ions or indium ions using ion implantation; and
      step S23: removing the first photoresist layer.

2. The method for preparing an ohmic contact electrode of a GaN-based device according to claim 1, wherein a process condition of the high temperature annealing process comprises: an annealing temperature of 850 to 1400° C.

3. The method for preparing an ohmic contact electrode of a GaN-based device according to claim 1, wherein the step S3 and the step S4 comprise the following steps:
   step S31: applying a second photoresist layer to an upper surface of a portion of the second dielectric layer corresponding to the first region;
   step S32: removing the portions of the first dielectric layer and the second dielectric layer corresponding to the ohmic contact electrode region respectively using a dry etching process;
   step 33: performing evaporation deposition of the metal layer on the upper surface of the GaN-based device using an electron beam evaporation process; and
   step 34: removing the second photoresist layer.

4. The method for preparing an ohmic contact electrode of a GaN-based device according to claim 3, wherein a process condition of the high temperature annealing process comprises: an annealing temperature of 850 to 1400° C. and an annealing duration of 10 to 60 minutes.

5. The method for preparing an ohmic contact electrode of a GaN-based device according to claim 1, wherein the silicon ions have an implantation energy of 30 to 200 keV and an implantation dose of $10^{14} cm^{-2}$ to $10^{16} cm^{-2}$; and
   wherein the indium ions have an implantation energy of 30 to 200 keV and an implantation dose of $10^{13} cm^{-2}$ to $10^{16} cm^{-2}$, and an annealing duration of 10 to 60 minutes.

6. The method for preparing an ohmic contact electrode of a GaN-based device according to claim 5, wherein a process condition of the high temperature annealing process comprises: an annealing temperature of 850 to 1400° C. and an annealing duration of 10 to 60 minutes.

7. The method for preparing an ohmic contact electrode of a GaN-based device according to claim 1, wherein the second dielectric layer is an SiN layer or an AN layer, and the second dielectric layer has a thickness of 10 to 200 nanometers.

8. The method for preparing an ohmic contact electrode of a GaN-based device according to claim 7, wherein a process condition of the high temperature annealing process comprises: an annealing temperature of 850 to 1400° C. and an annealing duration of 10 to 60 minutes.

9. The method for preparing an ohmic contact electrode of a GaN-based device according to claim 1, wherein the first dielectric layer is an SiN layer or an $SiO_2$ layer, and the first dielectric layer has a thickness of 10 to 50 nanometers.

10. The method for preparing an ohmic contact electrode of a GaN-based device according to claim 9, wherein a process condition of the high temperature annealing process comprises: an annealing temperature of 850 to 1400° C. and an annealing duration of 10 to 60 minutes.

11. The method for preparing an ohmic contact electrode of a GaN-based device according to claim 1, wherein the at least one of silicon ions or indium ions have an implantation depth of 80 to 120 nanometers.

12. The method for preparing an ohmic contact electrode of a GaN-based device according to claim 11, wherein a process condition of the high temperature annealing process comprises: an annealing temperature of 850 to 1400° C. and an annealing duration of 10 to 60 minutes.

13. The method for preparing an ohmic contact electrode of a GaN-based device according to claim 1, wherein the metal layer comprises a Ti/Au layer, a Ti/Pt/Au layer, a Ti/Al layer or a Ti/Al/Ni/Au layer.

14. The method for preparing an ohmic contact electrode of a GaN-based device according to claim 13, wherein a process condition of the high temperature annealing process comprises: an annealing temperature of 850 to 1400° C. and an annealing duration of 10 to 60 minutes.

* * * * *

UNITED STATES PATENT AND TRADEMARK OFFICE
CERTIFICATE OF CORRECTION

PATENT NO. : 11,239,081 B2
APPLICATION NO. : 16/968977
DATED : February 1, 2022
INVENTOR(S) : Yongliang Tan et al.

It is certified that error appears in the above-identified patent and that said Letters Patent is hereby corrected as shown below:

On the Title Page

Item (73) titled Assignee, Please delete:
"The 13th Research Institute of China Electronics"
And replace with:
The 13th Research Institute of China Electronics Technology Group Corporation Signed and Sealed this
Fourth Day of July, 2023

Katherine Kelly Vidal
*Director of the United States Patent and Trademark Office*